(12) United States Patent
Bueb et al.

(10) Patent No.: US 9,563,501 B2
(45) Date of Patent: Feb. 7, 2017

(54) PRESERVING DATA INTEGRITY IN A MEMORY SYSTEM

(75) Inventors: Christopher Bueb, Folsom, CA (US); Sean Eilert, Penryn, CA (US)

(73) Assignee: Micron Technology, Inc., Boise, ID (US)

(*) Notice: Subject to any disclaimer, the term of this patent is extended or adjusted under 35 U.S.C. 154(b) by 429 days.

(21) Appl. No.: 12/957,364

(22) Filed: Nov. 30, 2010

(65) Prior Publication Data
US 2012/0137195 A1    May 31, 2012

(51) Int. Cl.
| G06F 11/00 | (2006.01) |
| G06F 11/10 | (2006.01) |
| H03M 13/29 | (2006.01) |
| H03M 13/09 | (2006.01) |
| H03M 13/15 | (2006.01) |
| H03M 13/19 | (2006.01) |

(52) U.S. Cl.
CPC ...... *G06F 11/1012* (2013.01); *H03M 13/2906* (2013.01); *H03M 13/09* (2013.01); *H03M 13/1515* (2013.01); *H03M 13/19* (2013.01)

(58) Field of Classification Search
CPC .............. G06F 12/0246; G06F 11/0766; G06F 11/1004; G06F 11/1044; G06F 2211/109; G06F 3/0689; G06F 11/1012; G06F 11/10–11/1096; G06F 2211/1004–2211/1095; H03M 13/19; H03M 13/2906; H03M 13/09
See application file for complete search history.

(56) References Cited

U.S. PATENT DOCUMENTS

| 4,458,349 A * | 7/1984 | Aichelmann et al. ........ 714/6.24 |
| 8,892,980 B2 * | 11/2014 | Fillingim ...................... 714/760 |
| 2004/0088636 A1 * | 5/2004 | Cypher ......................... 714/764 |
| 2009/0125790 A1 * | 5/2009 | Iyer et al. ..................... 714/773 |
| 2010/0281340 A1 * | 11/2010 | Franceschini et al. ........ 714/763 |
| 2010/0332944 A1 * | 12/2010 | Cypher et al. ................ 714/763 |

OTHER PUBLICATIONS

Reed Solomon Codes by Joel Sylvester, pp. 1-7, 2006.*
Error Correcting Code by Robin Schriebman, pp. 1-14, 2006.*

* cited by examiner

*Primary Examiner* — Jason Bryan
(74) *Attorney, Agent, or Firm* — Dorsey & Whitney LLP (57) ABSTRACT

A method includes detecting that a first device in a memory array has degraded, the first device storing a portion of a data record, wherein the data record is encoded using a first error control technique. The method continues with recovering the data record using portions of the data record stored in devices other than the first device in the memory array and encoding the data record using a second error control technique. The method also includes storing the data record in the devices of the memory array other than the first device.

19 Claims, 7 Drawing Sheets

PRESERVING DATA INTEGRITY IN A MEMORY SYSTEM

FIELD

The present invention relates generally to memory devices, and more specifically, to data storage and retrieval in nonvolatile memory.

BACKGROUND

In a computer memory system, it is very important that the user be able to retrieve an exact copy of the data stored in the devices that constitute the system. To facilitate the retrieval of an exact copy, error control information may be added to each data word prior to storage in the data storage devices. As each data word is retrieved, the portion of each word that contains the error control information is examined so that errors present in the portion of the data word that contains the information can be detected and corrected. However, an error control code suitable for use with memory systems that include one type of storage device may not be suitable for use with systems that include other types of storage devices.

BRIEF DESCRIPTION OF THE DRAWINGS

Embodiments of the invention are illustrated by way of example and not limitation in the figures of the accompanying drawings, in which.

DESCRIPTION OF EMBODIMENTS

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification, discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or the apparatus may comprise a general purpose computing device selectively activated or reconfigured by a computer program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), nonvolatile memories such as electrically programmable read-only memories (EPROMs), electrically erasable and programmable read only memories (EEPROMs), or FLASH memories, or any other type of media suitable for storing electronic instructions, and capable of being coupled to a system bus for a computing device.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g. as in a cause an effect relationship).

Figure 1:
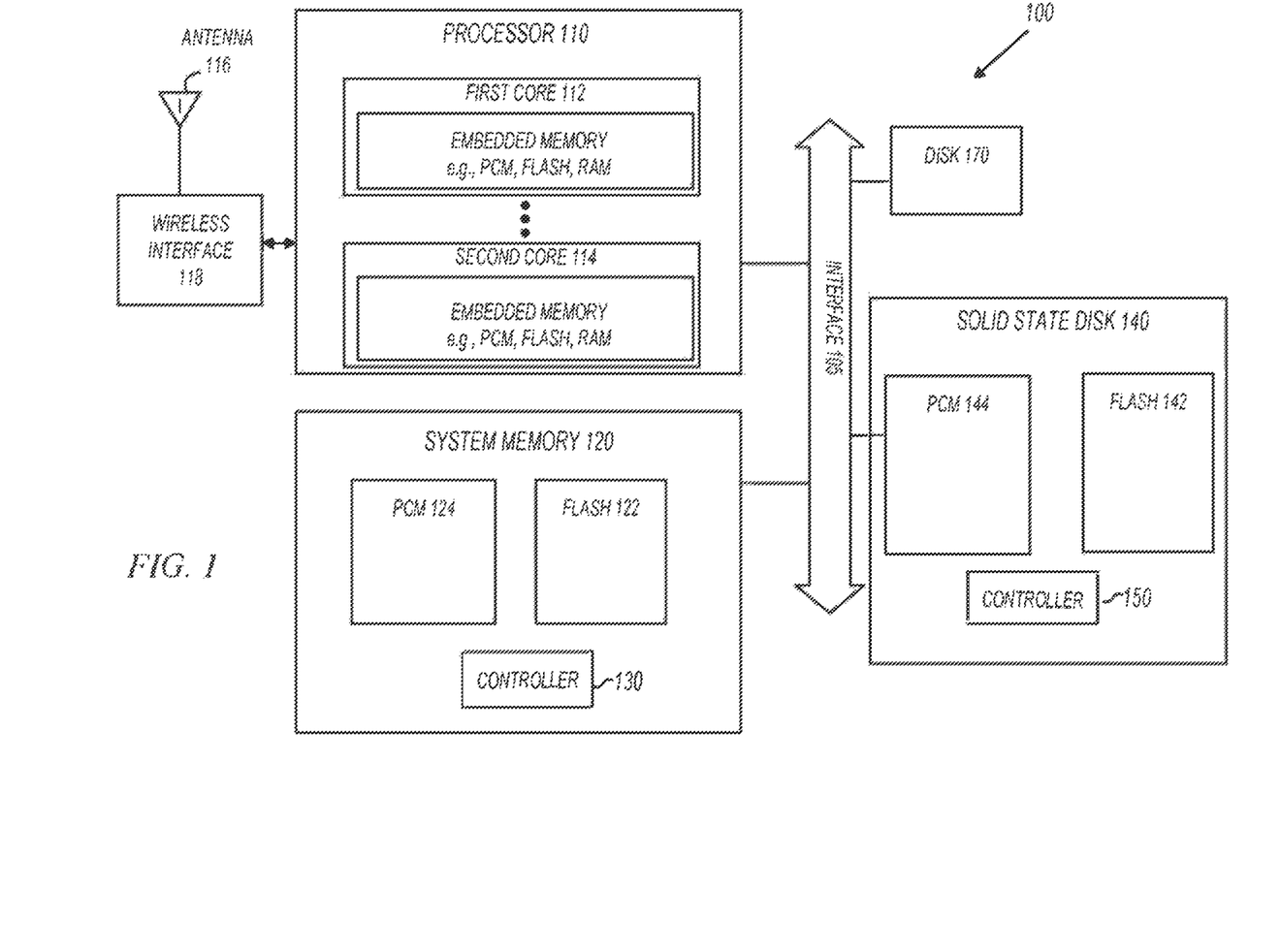
FIG. 1 shows an electronic system in accordance with various embodiments of the invention.

FIG. 1 shows a system 100 in accordance with various embodiments of the present invention. System 100 may be any type of device that includes memory without departing from the scope of the present invention. For example, system 100 may be a computer or a mobile phone with nonvolatile memory. In another example, system 100 may be a global positioning system (GPS) receiver or a portable media player with nonvolatile memory.

In the embodiment of FIG. 1, system 100 includes a wireless interface 118 coupled to antenna 116 to allow system 100 to communicate with other devices that also communicate over-the-air. As such, system 100 may operate as a cellular device or a device that operates in wireless networks such as, for example, Wireless Local Area Networks (WLANs), WiMax and Mobile WiMax based systems, Wideband Code Division Multiple Access (WCDMA), and Global System for Mobile Communications (GSM) networks, any of which may or may not operate in accordance with one or more standards. The various embodiments of the invention are not limited to operate in the above-identified network types; this is simply a list of examples. It should be understood that the scope of the present invention is not limited by the types of, the number of, or the frequency of the communication protocols that may be used by system 100. Embodiments are not, however, limited to wireless communication embodiments. Other non-wireless applications can make use of the various embodiments of the invention.

In some embodiments, wireless interface 118 may include one or more stand-alone Radio Frequency (RF) discrete or integrated analog circuits. In other embodiments, wireless interface 118 may be embedded within an integrated circuit that includes other components. For example, in some embodiments, wireless interface 118 may be included on a common integrated circuit with processor 110.

Processor 110 includes at least first core 112 and second core 114, and each core may include memory. For example, first core 112 may include volatile or nonvolatile memory, such as PCM, FLASH, RAM, and so forth. Each core may include any combination of different types of memory without departing from the scope of the present invention. Processor 110 may execute instructions from any suitable memory within system 100. For example, any memory within a processor core, or any of the memory devices within system memory 120, may be considered a computer-readable medium that has instructions stored that when accessed cause processor 110 to perform according to embodiments of the invention.

First core 112 and second core 114 may also make use of Magnetic Random Access Memory (MRAM), which employs magnetic storage elements formed from two ferromagnetic plates located at an intersection of a row and column line and selected by a Magnetic Tunnel Junction (MTJ) device. Current imparted to the row line in one direction causes a magnetic field operative on the MRAM cell biasing the MRAM cell toward a binary state. Due to a magnetic tunnel effect, the electrical resistance of the memory cell changes based on the orientation of the fields in the two plates.

First core 112 and the second core 114 may also make use of Ferro-electric Random Access Memory (FRAM), which employs memory cells that may include one transistor and one capacitor. The capacitor includes ferroelectric material and a bi-stable atom in the ferroelectric material that is shifted to form two stable polarization states. Memory cell data may be written by positively or negatively orienting the dipoles of the ferroelectric material via an applied polarizing voltage. Data may be read by detecting the voltage of the bit line (BL) connected with the memory cell. Current feed circuits supply electric currents to the bit lines for a predetermined period from a start of a read operation, and read control circuitry senses the direction of the electric polarization as either a high or a low logic state. Each orientation is stable and remains in place even after the electric field is removed, preserving the data within the memory without periodic refresh.

Processor 110 is shown coupled to interface 105. Interface 105 provides communication between processor 110 and the various other devices coupled to interface 105. For example, processor 110 may communicate with memory devices in system memory 120, solid state disk (SSD) 140, as well as disk 170. Interface 105 can include serial and/or parallel buses to share information along with control signal lines to be used to provide handshaking between processor 110 and the various other devices coupled to interface 105.

In some embodiments of the invention, system 100 may not include disk 170. For example, in some mobile phone embodiments, disk 170 may not be present. However, in other embodiments of the invention, such as computer-based applications, disk 170 may be included.

System memory 120 includes FLASH memory 122 and PCM 124 operating under the control of controller 130. FLASH memory 122 stores information by storing charge on a floating gate in a Metal Oxide Semiconductor (MOS) transistor. The stored charge alters the threshold voltage of the transistor, and the difference in threshold voltage is "read" to determine whether the stored information is a "0" or a "1". In some embodiments, varying amounts of charge are stored on the floating gate to represent more than one bit of information per memory cell. This is sometimes referred to as Multi-Level Cell (MLC) FLASH. FLASH memory 122 may be any type of FLASH memory, including NOR FLASH memory, NAND single level cell (SLC) memory, or NAND multi-level cell (MLC) memory.

As previously mentioned, system memory 120 also includes PCM 124. A PCM is a memory that stores information based on modifiable material properties, such as whether a material is in a crystalline or an amorphous state (phase). For example, in some embodiments, phase change memories include alloys of elements of group VI of the periodic table, such as Te or Se, that are referred to as chalcogenides or chalcogenic materials. Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage. Phase change memory may be referred to as a Phase Change Memory (PCM), Phase-Change Random Access Memory (PRAM or PCRAM), Ovonic Unified Memory (OUM), Chalcogenide Random Access Memory (C-RAM), or by other suitable names.

Memory devices within system memory 120 may be packaged in any manner. For example, in some embodiments, FLASH memory 122 and PCM 124 may be combined in a stacking process to reduce the footprint on a board, packaged separately, or placed in a multi-chip package with the memory component placed on top of the processor.

Solid state disk (SSD) 140 includes FLASH memory 142, PCM 144, and controller 150. Controller 150 may be any type of controller, including a microcontroller, a microprocessor, or the like. SSD 140 emulates the operation of a hard disk. For example, in some embodiments, SSD 140 may appear to the rest of the system as a FAT (file allocation table) formatted hard drive.

In operation, SSD 140 receives read and/or write requests. The read requests are satisfied by reading contents from FLASH memory 142 and from PCM 144, and the write requests are satisfied by writing to FLASH memory 142 and to PCM 144. Although not shown in FIG. 1, a translation layer may be used within SSD 140 to map logical addresses in the read and write requests to physical addresses in FLASH memory 142 and PCM 144. In some embodiments, the logical addresses include sector numbers and the physical addresses include blocks within the FLASH memory.

In embodiments of the invention, one or more of PCM 124, PCM 144, FLASH memory 122, and FLASH memory 142 includes individual memory devices that are arranged in a two-dimensional array. In this embodiment, portions of individual "data records" are stored using multiple memory devices that constitute the two-dimensional array. Thus, in one embodiment, a 256 kB data record is stored using 10 memory devices in which each memory device is located within a different memory module. In such an embodiment, an error control code, such as a Reed Solomon code, is applied to the data record prior to storage in the memory devices. In the event that 1 of the 10 memory devices experiences an unacceptable degradation in performance causing a loss of data stored within the device, information from the remaining 9 devices can be used to recover the portion of the data record stored in the degraded device.

After the recovery of the data record, the record may be encoded using a second error control technique. The second error control technique may be capable of detecting and correcting fewer errors than the Reed Solomon error control technique, making use of a reduced amount of error control information. The re-encoded data record may then be stored in the remaining 9 memory devices. In one embodiment, the second error control code may be a Hamming code. In another embodiment, the second error control code may be an even/odd parity technique, which may detect the presence of an error but may not have the ability to correct the error.

Embodiments of the invention may also make use of a table directly accessible by processor 110 or may perhaps be accessed at a level closer to one or more of PCM 124, PCM 144, FLASH memory 122, and FLASH memory 142 by way of controller 130 or controller 150. In these embodiments, the table includes a listing of memory locations along with the error control technique used to encode data stored at the memory locations. Thus, the table may indicate that data records stored at a first group of memory locations have been encoded using a Reed Solomon error control technique while data records stored at adjacent memory locations have been encoded using a Hamming error control technique or perhaps encoded using an even or an odd parity technique. Accordingly, when processor 110 requests a data record from system memory 120 or SSD 140, the appropriate error control decoding technique can be applied.

Figure 2:
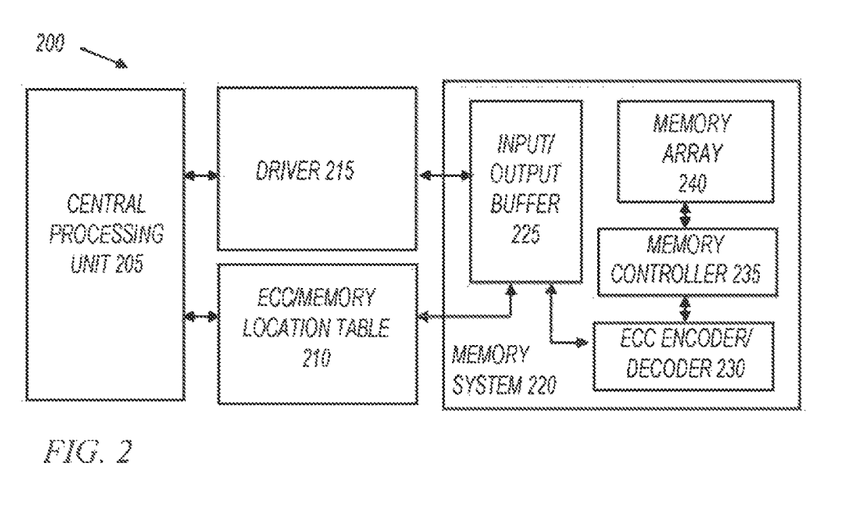
FIG. 2 shows a data storage and retrieval system in accordance with various embodiments of the invention.

FIG. 2 shows data storage and retrieval system 200 in accordance with various embodiments of the invention. In FIG. 2, central processing unit 205 interfaces with driver 215, which provides lower level timing and device handling services that enable input/output buffer 225 of memory system 220 to interface with processing unit 205. Central processing unit 205 also interfaces with error control code (ECC) and memory location table 210. Other interfaces to central processing unit 205, such as additional drivers, RAM and cache memories are not shown in FIG. 2.

Error control code/memory location table 210 provides a mapping of memory locations within memory array 240 along with an indication of the error control technique used to encode data at the various memory addresses within the array. In one embodiment, all memory locations within memory array 240 are by default assumed to be encoded using a Reed Solomon error control technique and table 210 indicates perhaps a small number of memory locations for which a different error control technique has been used to encode data at those locations. In another embodiment of the invention, table 210 includes an address mask that identifies the sizes and shapes of groups of memory locations for which a different error control technique has been used to encode data at those locations. The mask may include one or more boundaries wherein a first error control technique has been used to encode data at memory locations to a first side of the boundary while a second error control technique has been used to encode data at memory locations to a second side of the boundary. In another embodiment of the invention, error control code/memory location table 210 may be stored in firmware accessible by and proximate with microcontroller 235 within memory system 220. In this embodiment, table 210 enables substantially identical functionality as previously discussed, although in a location closer to memory array 240.

Memory system 220 also includes ECC encoder/decoder 230. When writing to memory array 240, ECC encoder/decoder 230 functions to encode a data record using the selected error control technique prior to storage of the record in the array. When reading from memory array 240, ECC encoder/decoder 230 applies a decoding algorithm appropriate for use with data encoded using the selected error control technique used for the encoding process.

In some embodiments, data records written to memory array 240 are "transformed" prior to writing. For example, the inverse (logical bit-wise complement) of a data record may be stored. This may be useful for mapping a data record onto a failing bit pattern within memory array 240. This may also be useful for reducing the number of bits to be programmed thereby limiting the cycling or reducing power consumption. Any transformation may be applied without departing from the scope of the present invention. Error control code/memory location table 210 may indicate whether data is transformed. For example, if the inverse of a data record is stored in memory array 240, error control code/memory location table 210 may include one or more bits to indicate the transformation.

Figure 3:
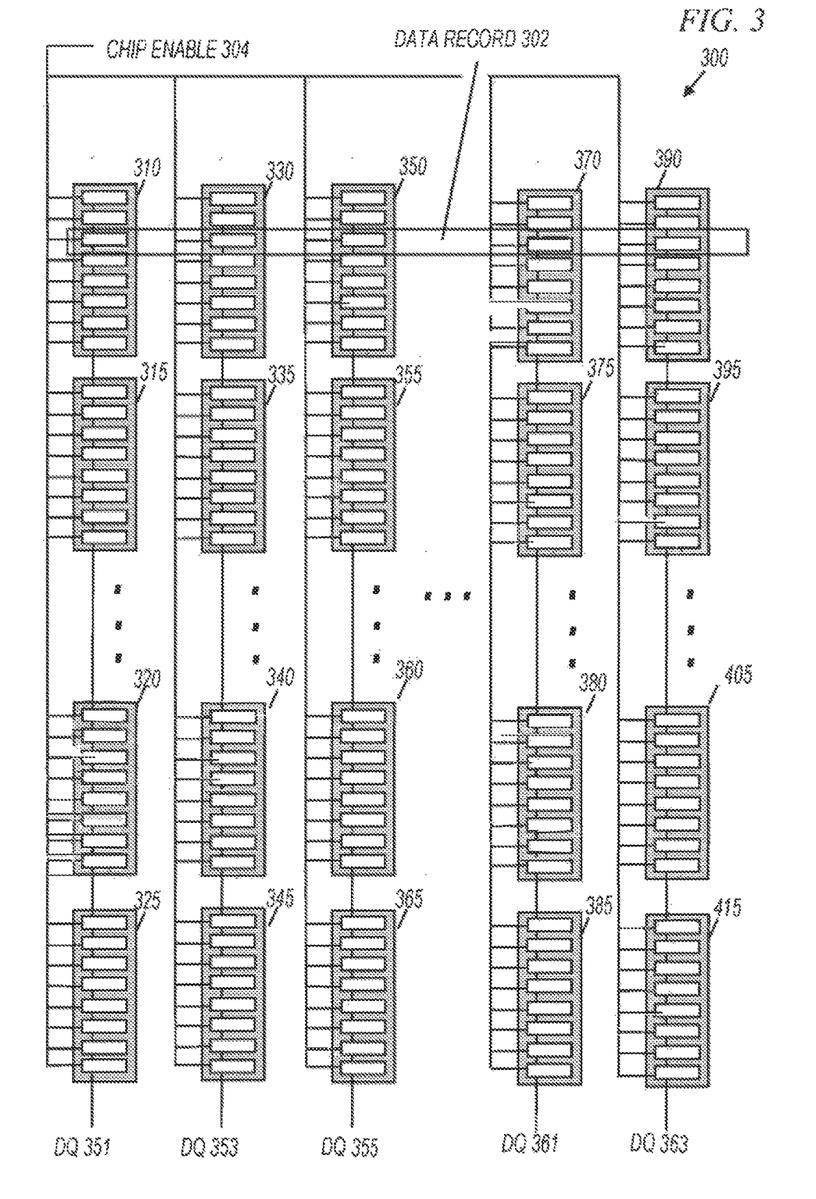
FIG. 3 shows an array of nonvolatile memory devices used in a memory system in accordance with various embodiments of the invention.

FIG. 3 shows array 300 of nonvolatile memory devices used in a memory system in accordance with various embodiments of the invention. In FIG. 3, data record 302 has been distributed among a number of devices of the array. To reduce the complexity of FIG. 3, only a small number of devices is shown. Thus, in one embodiment, memory devices 310, 330, 350, 370, and 390 may represent dozens of memory devices, each of which stores a portion of data record 302. In such an embodiment, memory devices 310, 330, and 350 represent the memory devices that include the information portion of data record 302 while memory devices 370 and 390 represent the memory devices storing the error control or parity information for the record.

In another embodiment, memory devices 310, 330, and 350 represent a smaller number (such as 8 or fewer) of memory devices in which each device stores a portion of data record 302 while memory devices 370 and 390 represent 2 memory devices that store the error control or parity information for record 302. In this embodiment, data record 302 has been encoded using a Reed Solomon error control technique and portions of the encoded data record are distributed among each of the 10 devices. Accordingly, in the event that one of the 10 memory devices experiences degradation in performance that renders the device unusable, the data record can be recovered by applying an appropriate Reed Solomon decoder to the portions of the encoded data record stored in the remaining 9 devices.

In a simplified example, in the event that data record 302 is 223 bits in length, a Reed Solomon (255, 223) code using 32 bits of error control (255−223=32) can provide the capability of correcting up to 16 symbol errors. Accordingly, in the event that one of the memory devices represented by 310, 330, 350, 370, and 390 experiences a degradation in performance, up to 16 symbol errors (all of which may perhaps be introduced by the degraded device) can be corrected by an appropriate Reed Solomon decoder. In this event, the 223 information bits may be re-encoded using a less robust technique (such as a Hamming code). Using such a technique, a smaller number of error control bits may be used. In one example in which a particular Hamming code is employed, 8 error control bits may be used to provide correction of 1 symbol in a word that is between 127 and 247 bits in length. Thus, although the loss of a memory device may result in a reduction in the number of error control bits available, a second and perhaps less robust error control technique allows the memory system to continue to operate, although in a less error-tolerant mode.

In another embodiment of the invention, a simple even/odd parity technique may be used to provide a level of error control in the event of the failure of a memory device. Using such a technique, a single bit may be added to each portion of data record 302 to indicate whether the binary digits that constitute the portion add to an even number or to an odd number. Thus, errors at portions of data record 302 may be detected although not necessarily corrected.

In the memory array of FIG. 3, devices 310, 330, 350, 370, and 390 may be organized in a single memory module. In a similar manner, devices 315, 335, 355, 375, and 395 may be organized in a single memory module. Similarly, devices 320, 340, 360, 380, and 405 may be organized in a single memory module. Similarly, devices 325, 345, 365, 385, and 415 may be organized in a single memory module. DQ lines 351, 353, 355, 361, and 363 provide read/write access for each of the memory devices of FIG. 3 while chip enable 304 is used to select the array of nonvolatile memory devices 300.

Figure 4:
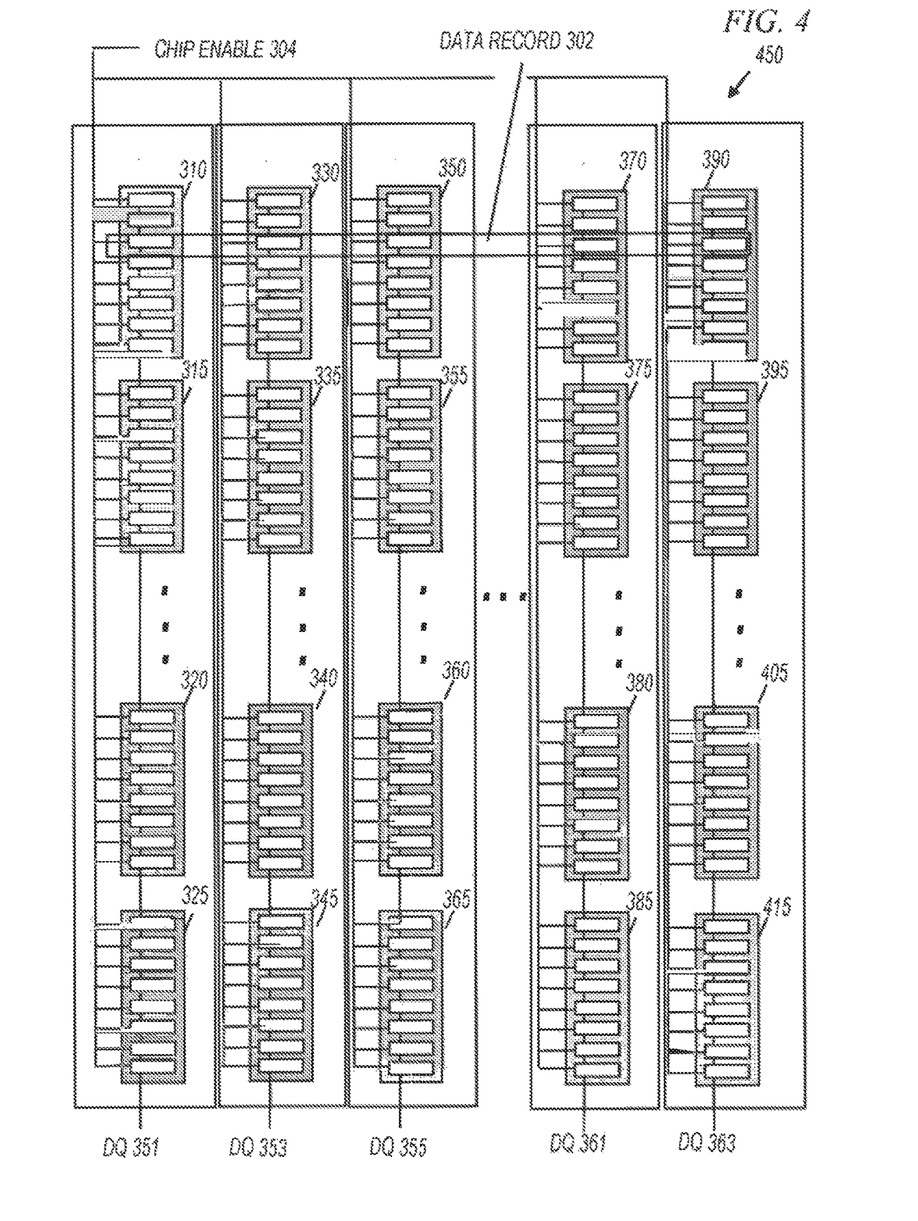
FIGS. 4-5 show an memory array having portions of a data record distributed among multiple devices in accordance with various embodiments of the invention.
Figure 5:
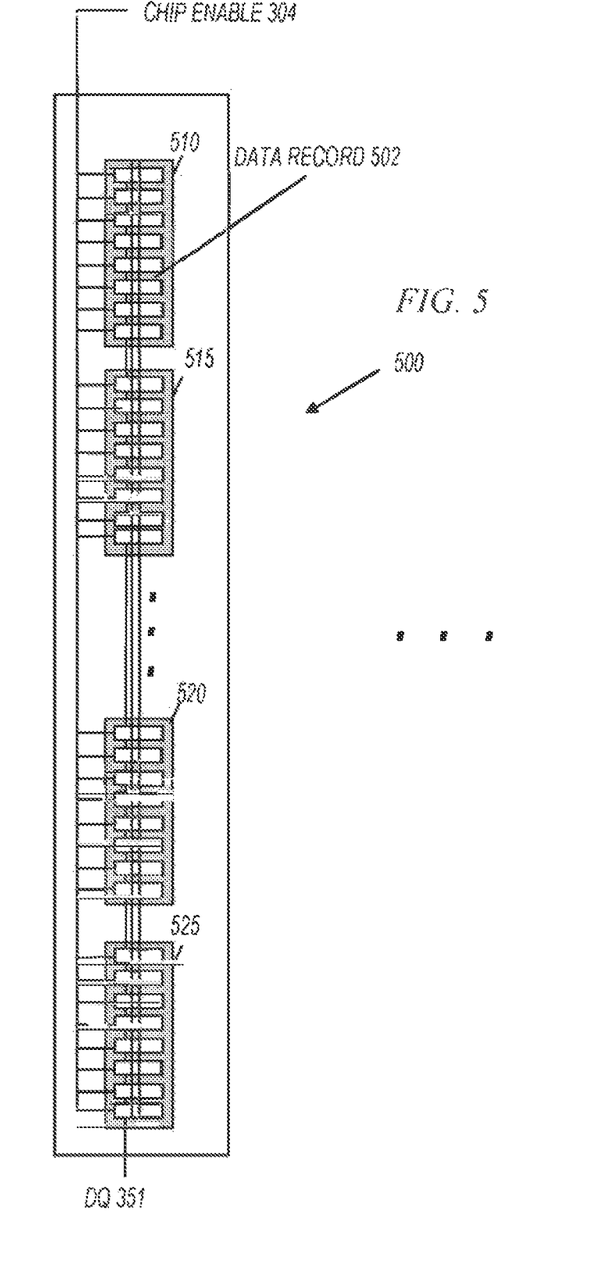

FIGS. 4-5 show memory array (450) having portions of a data record distributed among multiple devices in accordance with various embodiments of the invention. In FIG. 4, memory devices 310, 315, 320, and 325, along with a number of memory devices in between devices 315 and 320 are shown as constituting a first memory module. In a similar manner, memory devices 330, 335, 340, and 345, along with a number of memory devices between devices 335 and 340 are shown as constituting a second memory module. In a similar manner, memory devices 350, 355, 360, and 365, along with a number of memory devices between devices 355 and 360 constitute a third memory module. In a similar manner, memory devices 370, 375, 380, 385, along with a number of memory devices between devices 375 and 380 constitute a fourth memory module. In a similar manner, memory devices 390, 395, 405, and 415, along with a number of memory devices between devices 395 and 405 constitute a fifth memory module. Thus, in the event of a failure of one of the modules shown in FIG. 4, the portion of data record 302 stored in the remaining memory modules can be re-encoded using a reduced number of error control bits and the information redistributed over those remaining memory modules.

FIG. 5 shows memory array (500) having portions of a data record distributed among multiple devices in accordance with various embodiments of the invention. In FIG. 5, data record 502 is distributed among memory devices 510, 515, 520, 525, along with a number of memory devices between modules 515 and 520. In this embodiment, the removal of a single memory module results in the removal of data record 502 in its entirety.

In FIGS. 3-5, arrays 300, 450, and 500 may include a number of memory modules equal to $2^n$, (where n is a positive integer) or may perhaps include a number of memory module other than $2^n$. Further, each memory module may include $2^n$ device packages or may include a number of device packages other than $2^n$.

Figure 6:
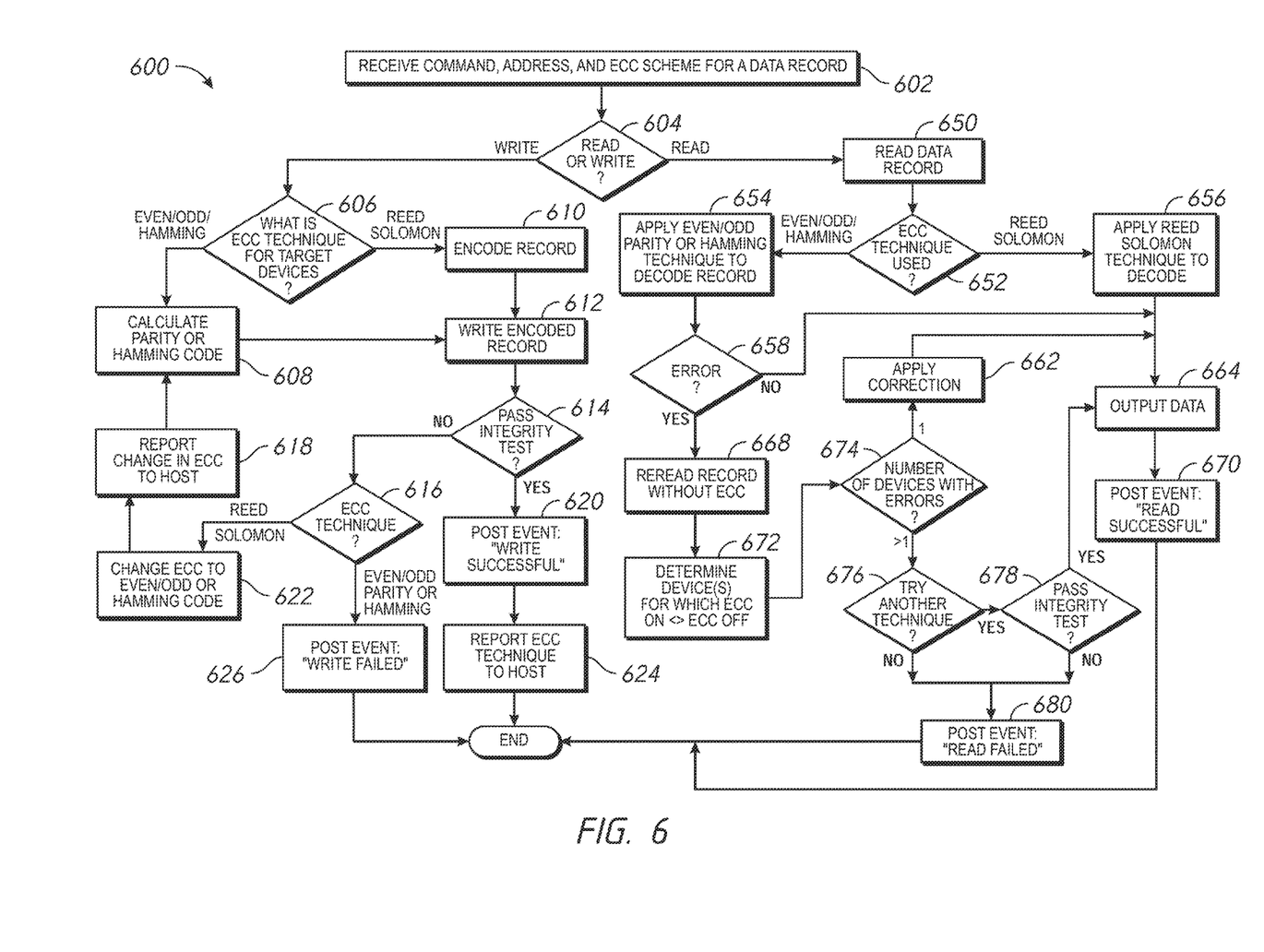
FIG. 6 shows a flow diagram for a method of preserving data integrity in a memory system in accordance with various embodiments of the invention.

FIG. 6 shows a flow diagram for method 600 of preserving data integrity in a memory system in accordance with various embodiments of the invention. The method begins at 602 in which a memory system receives a command, an address, and an error control technique. At 604, the command is interpreted as either being a read command or a write command. In the event that a write command has been received, 606 is performed in which a determination is made as to whether the error control technique for the target device is a Reed Solomon, an even/odd mode parity, or a Hamming technique. In the event that the chosen error control technique is even/odd parity or Hamming, 608 is performed in which the parity or the error control bits for a Hamming code are calculated. The method then proceeds to 612 in which the Hamming encoded record or the data record plus even/odd parity bits are written to memory.

Returning now to 606, in the event that the selected error control technique is a Reed Solomon technique, 610 is performed in which the additional Reed Solomon error control bits are calculated. 612 is then performed in which the Reed Solomon encoded data record is written to memory. The method then proceeds to 614 in which an integrity test is performed. The integrity test of 614 may include rereading the encoded record, written to memory at 612, to determine if the stored record matches the encoded record. In the event that the integrity test of 614 indicates successful retrieval of an exact copy of the encoded data record, 620 is performed in which a "write successful" event is posted. 624 is then performed in which the selected error control technique is reported to a host. Thus, in the event that an error control coding/memory location table (such as 210 of FIG. 2) is being used, the selected error control technique can be reported to the host (such as central processing unit 205 of FIG. 2).

Returning now to 614, in the event that the integrity test indicates an unsuccessful retrieval of an exact copy of the encoded data record, 616 is performed in which a determination is made as to the error control technique used in 612 to encode the data record. In the event that a Reed Solomon technique was used in 612, 622 is performed in which the error control technique is changed from Reed Solomon to an even/odd parity technique or to a Hamming technique. At 618, the selected technique is reported to the host (such as central processing unit 205 of FIG. 2) and 608 is performed in which even/odd parity or a Hamming code is calculated.

In the event that the error control technique determined in 616 is an even/odd parity or a Hamming technique, 626 is performed in which a "write failed" event is posted. The "write failed" event indicates that neither a Reed Solomon, nor a less error-tolerant error control technique, such as a Hamming technique or an even/odd parity technique, has resulted in the successful writing of the data record to memory.

Returning now to 604, in the event that the command received in 602 is a read command, 650 is performed in which a data record at the selected memory locations is read. At 652, a determination is made as to the error control technique used to encode the data record being read. In the event that the error control technique is an even/odd parity or a Hamming technique, 654 is performed in which the selected decoding technique is applied. In the event that a number of errors that exceeds the correction capability of the selected error control technique is detected, as determined in 658, 668 is performed in which the data record (or portions thereof) may be read a second time with the error control decoding disabled.

In some embodiments, the disabling of the error control decoding capability may provide a level of insight as to whether errors are being introduced at an output of each memory module or whether the degradation has occurred closer to the memory storage devices. The disabling of the error control decoding (668) may take one of several forms. In one embodiment in which a simple even/odd parity technique is used, the memory device or memory module is queried, and the parity bit is ignored. In the event that a Hamming technique has been employed, the syndrome (that is, the error vector that results from multiplying received code words of the data record by a parity check matrix) is ignored.

The method continues at 672, which includes determining the devices for which the enabling or disabling of the error control decoding capability does not appear to affect the received data. At 674 a determination is made as to the number of devices that are exhibiting errors. In another embodiment of the invention, the determination at 674 identifies whether the errors detected can be corrected using the selected decoding technique. In the event that only one device is exhibiting errors, or perhaps the overall number of errors is within the correction capability of the selected error control technique, 662 is performed in which correction is applied to the received record. 664 is then performed at which the record being read is output. 670 is then performed at which a "read successful" event is posted.

In the event that 674 indicates that a number of devices greater than 1 have output erroneous data or perhaps if the detected errors cannot be corrected, 676 is performed in which another technique may be attempted. In one embodiment of the invention, 676 may include reading the data record a second time to determine if a transient in a read/write (DQ) output or other occurrence was responsible for the errors detected in a previous attempt to read the data record. In the event that the second attempt to read the data record is successful to the extent that the integrity test of 678 can be passed, 664 is performed in which the data is output. In the event that the integrity test of 678 cannot be passed, 680 is performed in which a "read failed" event is posted.

Figure 7:
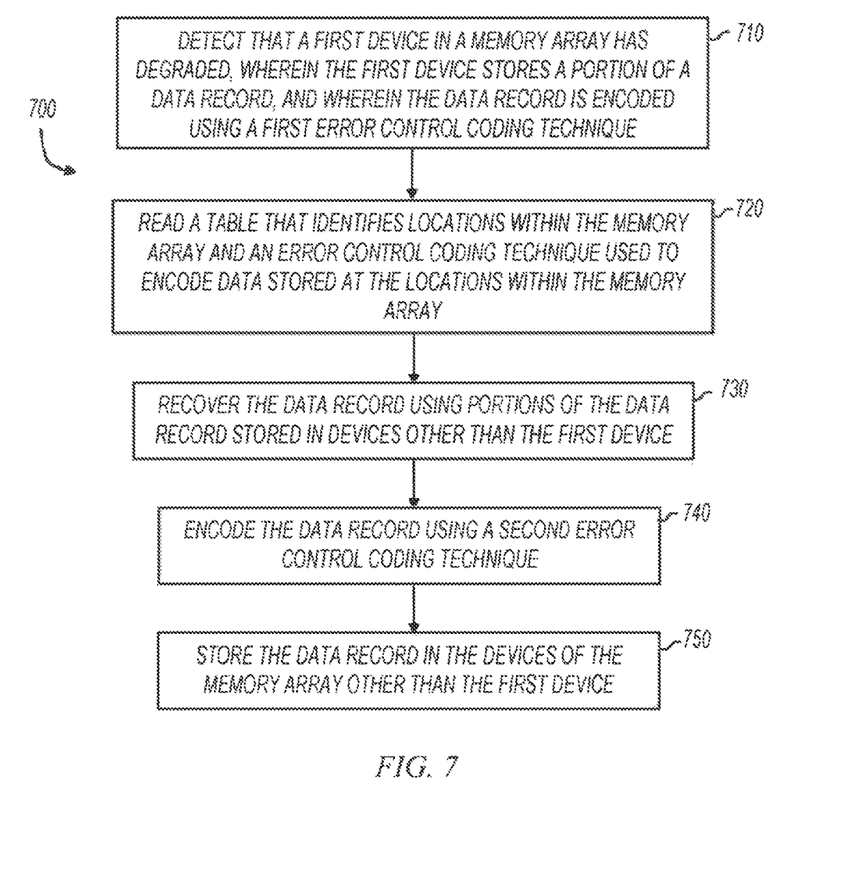
FIG. 7 shows a simplified flow diagram for a method of preserving data integrity in a memory system in accordance with various embodiments of the invention.

FIG. 7 shows a simplified flow diagram for method 700 of preserving data integrity in a memory system in accordance with various embodiments of the invention. At 710, a first device in a memory array is detected as being degraded or may perhaps have failed entirely. In 710, the first device stores a portion of a data record, with the data record being encoded using a first error control technique. In 710 the first error control technique may be a Reed Solomon technique. 720 includes reading a table that associates locations within the memory array and an error control technique used to encode data stored at the locations within the memory array. 720 may also include loading a decoding algorithm that is designed to decode data encoded using the error control technique read from the table. At 730, portions of the data record stored in devices other than the first device are used to recover the portion of the data stored in the first device.

At 740, a second error control technique, such as a Hamming or an even/odd parity technique is used to encode the data record. At 750, the data record, encoded by way of the second error control technique, is stored in devices other than the first (failed) device.

In at least one embodiment of the invention, not all of 710, 720, 730, 740, and its 750 are performed. Thus, an embodiment of the invention may include detecting (710) that a first device in a memory array has degraded, recovering (730) the data record using portion of the data record stored in devices other than the first device in the memory array, encoding (740) the data record using a second error control technique, and storing (750) the data record in the devices of the memory array of other than the first device.

Figure 8:
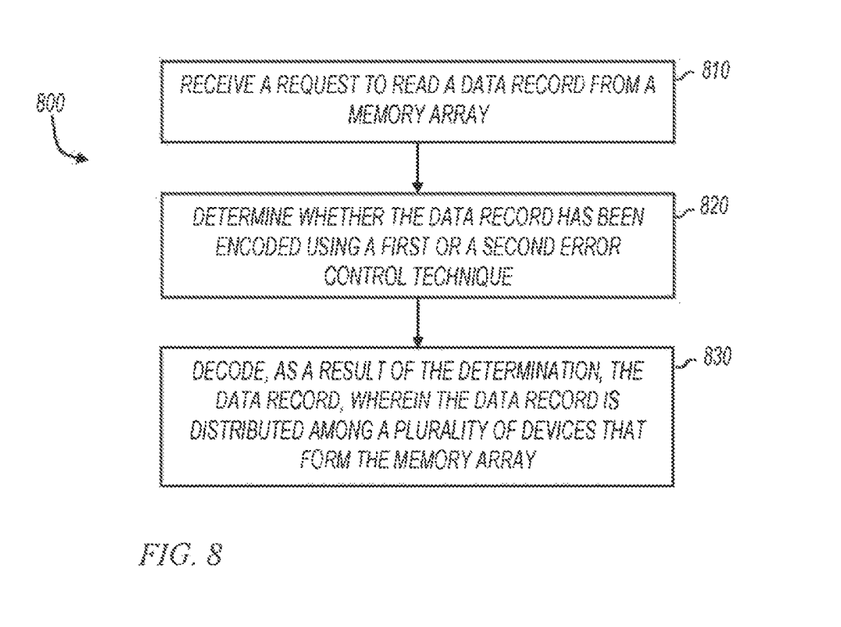
FIG. 8 shows a flow diagram for reading a data record in accordance with various embodiments of the invention.

FIG. 8 shows a flow diagram for method 800 of reading a data record in accordance with various embodiments of the invention. At 810, a request is received to read a data record from a memory array. At 820, a determination is made as to whether the data record has been encoded using a first or a second error control technique. 820 may include searching entries of a table (such as ECC/memory location table 210) that associates addresses of the memory array with the first or the second error control technique. At 830, as a result of the determination, the data record is decoded, wherein the data record is distributed among a plurality of devices that form the memory array.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A method comprising: detecting that a first device in a memory array has degraded, the first device storing a portion of a data record, wherein the data record is encoded using a first error control technique, and the first error control technique corrects multiple symbol errors;
    recovering the data record using portions of the data record stored in devices other than the first device in the memory array;
    encoding the data record using a second error control technique, wherein the second error control technique is different from the first error control technique;
    storing the data record encoded using the second error control technique across devices of the memory array other than the first device; and
    reading a table that identifies a subset of physical locations within the memory array and an error control technique used to encode data stored at each physical location of the subset of physical locations within the memory array, wherein each physical location within the memory array not included in the subset of physical locations is assumed to be encoded using a Reed-Solomon error control technique.

2. The method of claim 1, wherein the second error control technique is an even or an odd parity technique.

3. The method of claim 1, wherein at least one of the error control techniques uses a Hamming code.

4. The method of claim 1, wherein the table is accessed by a memory controller proximate with the memory array.

5. The method of claim 1, wherein the table is accessed by a central processing unit.

6. The method of claim 1, wherein the table indicates that a stored record is a transformation of the data.

7. The method of claim 6 wherein the transformation is a logical inverse.

8. A method comprising:
receiving a request to read a data record from a memory array;
determining whether the data record has been encoded using a first or a second error control technique, wherein the first error control technique corrects multiple symbol errors, and wherein the first and second error control techniques are different,
wherein the determining further comprises reading a table that identifies a subset of physical locations within the memory array and an error control technique used to encode data stored at each physical location of the subset of physical locations within the memory array, wherein each physical location within the memory array not included in the subset of physical locations is assumed to be encoded using a Reed-Solomon error control technique; and
decoding the data record, wherein the data record is distributed among a plurality of devices that form the memory array.

9. The method claim 8, wherein the second error control technique uses one of the group consisting of:
an even parity technique, an odd parity technique, and a Hamming technique.

10. A non-transitory computer-readable medium having instructions stored thereon that when accessed result in a computer performing:
detecting that a first device in a memory array has degraded, the first device storing a portion of a data record, wherein the data record is encoded using a first error control technique, and the first error control technique corrects multiple symbol errors;
recovering the data record using portions of the data record stored in devices other than the first device in the memory array;
encoding the data record using a second error control technique, wherein the second error control technique is different from the first error control technique;
storing the data record encoded using the second error control technique across devices of the memory array other than the first device; and
reading a table that identifies a subset of physical locations within the memory array and an error control technique used to encode data stored at each physical location of the subset of physical locations within the memory array, wherein each physical location within the memory array not included in the subset of physical locations is assumed to be encoded using a Reed-Solomon error control technique.

11. The non-transitory computer-readable medium of claim 10, wherein the table indicates that a stored record is a transformation of the data.

12. A memory system comprising;
a plurality of memory devices arranged in an array, wherein portions of a data record are distributed among certain ones of the plurality of memory devices, and the data record has been encoded using a first error control technique, wherein the first error control technique corrects multiple symbol errors;
a controller for detecting when one of the certain ones of the plurality of memory devices has degraded, wherein the controller recovers the data record by applying a first algorithm to the data record, and wherein the controller encodes the data record using a second error control technique, wherein the second error control technique is different from the first error control technique, and the controller stores the data record encoded using the second error control technique across memory devices other than one of the certain ones of the plurality of memory devices; and
a table stored in firmware accessible to the controller, wherein the table identifies a subset of physical locations within the memory array and an error control technique used to encode data stored at each physical location of the subset of physical locations within the memory array, wherein each physical location within the memory array not included in the subset of physical locations is assumed to be encoded using a Reed-Solomon error control technique.

13. The memory system of claim 12, wherein the second error control technique is one of the group consisting of:
applying even parity, applying odd parity, and applying a Hamming code.

14. The memory system of claim 12, wherein the certain ones of the plurality of memory devices are arranged on a single memory module.

15. The memory module of claim 12, wherein the certain ones of the plurality of memory devices are arranged on a plurality of memory modules.

16. The memory system of claim 12, wherein the array includes a number of memory modules equal to other than $2^n$, and wherein the memory modules includes $2^n$ device packages.

17. The method of claim 1, wherein the data record is encoded with the first error control technique prior to storage in the memory array.

18. The method of claim 1, wherein reading the table is performed by a processor coupled to a system memory that includes the memory array.

19. The method of claim 1, wherein reading the table is performed by a controller coupled to the memory array.

* * * * *